US012672412B2

(12) United States Patent　　　　(10) Patent No.:　　US 12,672,412 B2
Le Maoult et al.　　　　　　　　　(45) Date of Patent:　　Jun. 30, 2026

(54) METHOD FOR PRODUCING AN LED AND LED PRODUCED BY SAID METHOD

(71) Applicant: Commissariat à l'Énergie Atomique et aux Énergies Alternatives, Paris (FR)

(72) Inventors: Corentin Le Maoult, Grenoble Cedex (FR); David Vaufrey, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 692 days.

(21) Appl. No.: 18/015,936

(22) PCT Filed: Jul. 16, 2020

(86) PCT No.: PCT/FR2020/051276
§ 371 (c)(1),
(2) Date: Jan. 12, 2023

(87) PCT Pub. No.: WO2022/013485
PCT Pub. Date: Jan. 20, 2022

(65) Prior Publication Data
US 2023/0275116 A1　　Aug. 31, 2023

(51) Int. Cl.
*H10H 29/14*　　　(2025.01)
*H10H 20/01*　　　(2025.01)
(Continued)

(52) U.S. Cl.
CPC .......... *H10H 29/142* (2025.01); *H10H 20/01* (2025.01); *H10H 20/812* (2025.01); *H10H 20/822* (2025.01)

(58) Field of Classification Search
CPC .... H10H 20/01; H10H 20/812; H10H 20/821; H10H 20/822; H10H 29/142
See application file for complete search history.

(56) References Cited

U.S. PATENT DOCUMENTS

2016/0315218 A1　10/2016　Bour et al.
2017/0170360 A1 *　6/2017　Bour ..................... H10H 20/84
2020/0366050 A1 *　11/2020　McLaurin ........... H01S 5/34333

FOREIGN PATENT DOCUMENTS

KR　　　　20100123504 A　*　11/2010
WO　　WO 2015/099944 A1　　7/2015
　　　　　　　A1

OTHER PUBLICATIONS

International Preliminary Report on Patentability for International Application No. PCT/FR2020/051276, mailed Jan. 26, 2023.

(Continued)

*Primary Examiner* — Matthew C Landau
*Assistant Examiner* — Dmitriy Yemelyanov
(74) *Attorney, Agent, or Firm* — Wolf, Greenfield & Sacks, P.C.

(57)　　　　ABSTRACT

A light-emitting diode manufacturing method, including the successive steps of: a) forming an active layer including a stack of multiple quantum wells, each quantum well including a layer made of a semiconductor alloy; b) forming a trench for singularizing the diode, the trench crossing the active layer; and c) applying to the sides of the active layer, at the level of the lateral walls of the trench, a chemical treatment capable of etching a first component of the semiconductor alloy selectively over at least another component of the semiconductor alloy, wherein the bandgap width of the semiconductor alloy is a function of the concentration of the first component in the alloy.

10 Claims, 1 Drawing Sheet

(51) Int. Cl.
    H10H 20/812 (2025.01)
    H10H 20/822 (2025.01)

(56)                  References Cited

OTHER PUBLICATIONS

PCT/FR2020/051276, Jan. 26, 2023, International Preliminary Report on Patentability.
International Search Report and Written Opinion for International Application No. PCT/FR2020/051276 mailed Apr. 6, 2021.

* cited by examiner

METHOD FOR PRODUCING AN LED AND LED PRODUCED BY SAID METHOD

CROSS REFERENCE TO RELATED APPLICATIONS

This Application is a national stage filing under 35 U.S.C. § 371 of International Patent Application Serial No. PCT/FR2020/051276, filed Jul. 16, 2020, the contents of which are incorporated herein by reference in its entirety.

TECHNICAL BACKGROUND

The present disclosure generally relates to the field of light-emitting diodes (LED). It more particularly aims at the forming of LEDs based on inorganic semiconductor materials.

PRIOR ART

Various LED manufacturing methods have been provided.

It would be desirable to at least partly improve certain aspects of these methods and of the LEDs obtained by such methods.

The passivation of the side of a stack of LEDS made up of inorganic semiconductor materials is more particularly considered herein.

SUMMARY

An embodiment provides a light-emitting diode manufacturing method, comprising the successive steps of:
a) forming an active layer comprising a stack of multiple quantum wells, each quantum well comprising a layer made of a semiconductor alloy;
b) forming a trench for singularizing the diode, said trench crossing the active layer; and
c) applying to the sides of the active layer, at the level of the lateral walls of the trench, a chemical treatment capable of etching a first component of the semiconductor alloy selectively over at least another component of the semiconductor alloy, wherein the bandgap width of the semiconductor alloy is a function of the concentration of the first component in the alloy.

According to an embodiment, the bandgap width of the semiconductor alloy is all the larger as the concentration of the first component in the alloy is low.

According to an embodiment, the semiconductor alloy of the quantum wells is a ternary III-V compound.

According to an embodiment, the semiconductor alloy of the quantum wells is a quaternary III-V compound.

According to an embodiment, the semiconductor alloy of the quantum wells is indium gallium nitride or aluminum indium gallium phosphide.

According to an embodiment, the chemical treatment applied at step c) is a treatment with a hydrochloric acid solution or a treatment with an ammonium sulfide solution.

According to an embodiment, at step b), the trench is formed by a dry etching method.

According to an embodiment, at step b), the trench is formed by RIE or ICP etching.

According to an embodiment, step a) further comprises the forming of a first semiconductor layer of a first conductivity type, on the side of a first surface of the active layer, and the forming of a second semiconductor layer of a second conductivity type opposite to the first conductivity type, on the side of a second surface of the active layer.

According to an embodiment, the trench formed at step b) thoroughly crosses the second semiconductor layer and the active layer, and emerges onto the upper surface or into the first semiconductor layer.

According to an embodiment, said first component of the semiconductor alloy of the quantum wells is indium.

Another embodiment provides a light-emitting diode comprising an active layer comprising a stack of multiple quantum wells, each quantum well comprising a layer made of a semiconductor alloy, where the concentration of a first component of the alloy is lower in a peripheral portion of said layer than in a central portion of said layer.

According to an embodiment, the first component of the semiconductor alloy of the quantum wells is indium.

According to an embodiment, the active layer has, in top view, a generally circular shape.

According to an embodiment, the number of quantum wells of the stack of multiple quantum wells of the active layer is smaller than or equal to 10 and preferably smaller than or equal to 5.

According to an embodiment, the thickness of each quantum well of the active layer is smaller than or equal to 5 nm, and preferably in the range from 1 to 3 nm.

BRIEF DESCRIPTION OF THE DRAWINGS

The foregoing and other features and advantages will be discussed in detail in the following non-limiting description of specific embodiments in connection with the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. More particularly, only one step, linked to the passivation of the sides of a LED made up of inorganic semiconductor materials has been detailed. The various other steps capable of being implemented to form the LED have not been detailed, the described embodiments being compatible with all or most known methods of forming a LED made up of inorganic semiconductor materials.

In the following disclosure, unless specified otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
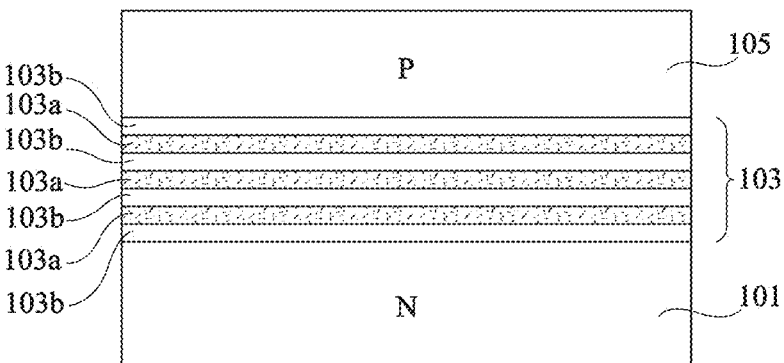
FIG. 1 is a cross-section view schematically showing an example of a stack of LEDs.

FIG. 1 is a cross-section view schematically showing a stack of LEDs made up of inorganic semiconductor materials.

The stack of FIG. 1 comprises a region 101 made of an N-type doped inorganic semiconductor material, for example, N-type doped gallium nitride (GaN).

The stack of FIG. 1 further comprises an active region 103 made up of inorganic semiconductor materials, arranged on the upper surface of region 101, for example, in contact with the upper surface of region 101. Active region 103 is formed of a stack of multiple quantum wells. As an example, active region 103 is formed of an alternation of semiconductor layers 103a of a first material and of semiconductor layers 103b of a second material, the bandgap of the first material being narrower than that of the second material. Each layer 103a of the first material is sandwiched between two layers 103b of the second material and defines a quantum well. As an example, each layer 103a of the first material is in contact, by its lower surface, with a layer 103b of the second material and, by its upper surface, with another layer 103b of the second material.

As an example, the first material (layers 103a) is a semiconductor alloy containing indium, for example, indium-gallium nitride (InGaN). The second material (layers 103b) may be a semiconductor alloy comprising no indium, for example, gallium nitride (GaN) or aluminum-gallium nitride (AlGaN), or having an indium concentration lower than that of the first material, for example, indium gallium nitride (InGaN) having an indium content lower than that of layers 103a.

The stack of FIG. 1 further comprises a region 105 made of a P-type doped inorganic semiconductor material, for example, P-type doped gallium nitride (GaN), arranged on the upper surface of active region 103, for example, in contact with the upper surface of active region 103.

Regions 101 and 105 respectively define a cathode region and an anode region of the LED. A cathode electrode (not shown) in contact with region 101 and an anode electrode (not shown) in contact with region 105 may be provided to polarize the LED. When a current flows between the anode region 105 and the cathode region 101 of the LED, photons are generated in active region 103, particularly inside of the quantum wells defined by layers 103 a.

In this example, the main emission wavelength of the LED is essentially defined by the indium concentration in the alloy forming layers 103a.

To form a LED of the type shown in FIG. 1, regions 101, 103, and 105 may first be deposited in the form of layers continuously extending across a substantially uniform thickness over the entire surface of a support substrate (not shown). Trenches may then be etched through all or part of the thickness of the stack to laterally delimit a plurality of individually-addressable elementary LEDs. As an example, in top view, the trenches form a continuous gate delimiting a plurality of islands or mesas, each corresponding to an elementary LED.

In practice, it can be observed that the quantum efficiency (ratio of the number of radiative recombinations, that is, recombinations resulting in the emission of a photon, to the total number of recombinations, be they radiative or non-radiative, in the LED), of a LED of the type described hereabove decreases when the lateral dimensions of the LED decrease, and this particularly at a low current density, for example, for current densities in the LED smaller than 40 A/cm$^2$.

The quantum efficiency decrease observed for LEDs of small dimensions may be explained by the fact that the etching implemented to singularize the LEDs, for example, a dry etching, for example, of RIE ("reactive ion etching") or ICP ("inductively coupled plasma") type, inevitably induces a degradation of the semiconductor crystal in the vicinity of the sides of the LEDs. The smaller the lateral dimensions of the LED, the more the volume of the semiconductor material impacted by such degradations becomes significant as compared with the total volume of semiconductor material of the LED. The peripheral areas degraded by the etching having a lower quantum efficiency, this results in a quantum efficiency decrease generally lower for LEDs of small dimensions than for LEDs of large dimensions.

Studies conducted by the inventors have highlighted that certain parasitic recombination phenomena (non-radiative or radiative at unwanted wavelengths), particularly recombinations of SRH (Shockley Read Hall) type, linked to the existence of parasitic energy levels in the bandgap of the semiconductor in the vicinity of the LED sides, mainly occur in the layers of quantum wells 103a, where the concentrations of carriers of opposite signs are the highest.

According to an aspect of the described embodiments, after the step of etching the vertical LED singularization trenches, a step of chemical treatment of the sides of the LEDs inside of the trenches, specifically aiming at passivating the sides of the layers of the quantum wells 103a of the LEDs, is provided.

Figure 2A:
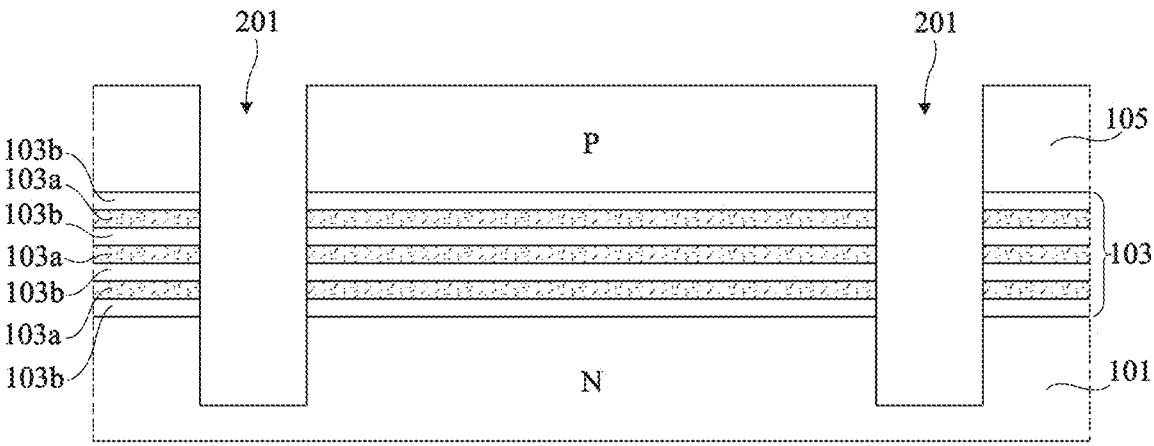
FIG. 2A is a cross-section view schematically showing a structure obtained at the end of a step of a LED manufacturing method according to an embodiment.
Figure 2B:
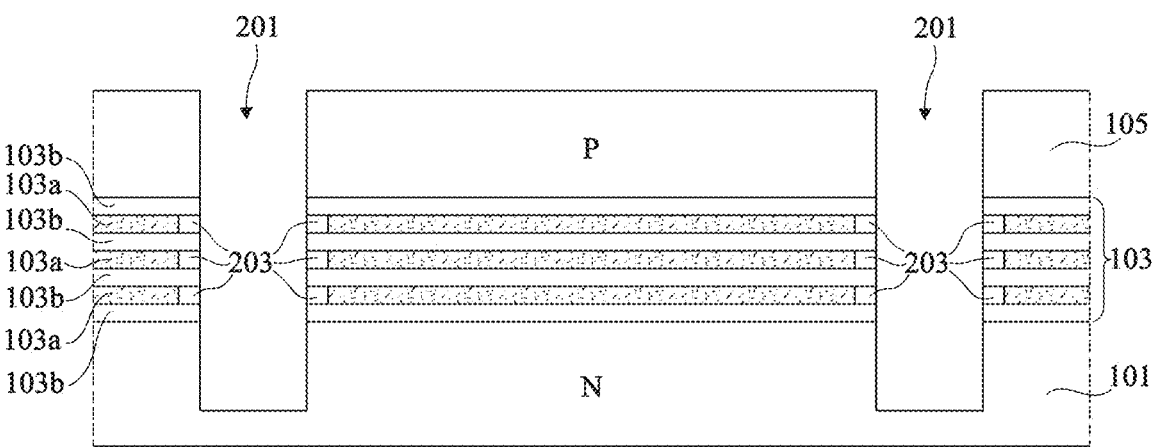
FIG. 2B is a cross-section view schematically showing a structure obtained at the end of another step of a LED manufacturing method according to an embodiment.

FIGS. 2A and 2B illustrate successive steps of an example of a LED manufacturing method according to an embodiment.

In this example, it is started from a stack comprising, in the order from the upper surface of a support substrate, not shown, an N-type doped semiconductor layer 101, an active layer 103, and a P-type doped semiconductor layer 105, such as described hereabove in relation with FIG. 1. Layers 101, 103, and 105 may be successively formed by epitaxy from the upper surface of a growth substrate, not shown.

FIG. 2A illustrates the structure obtained at the end of a step of etching trenches 201 vertically extending through the stack, from the upper surface thereof. Trenches 201 laterally delimit one or a plurality of individually—addressable elementary LEDs. In the shown example, trenches 201 thoroughly cross upper semiconductor layer 105 and active layer 103, and emerge onto lower semiconductor layer 101 without thoroughly crossing it. In other words, in this example, the elementary LEDs remain electrically coupled to one another by their cathode regions. The described embodiments are however not limited to this specific example.

Trenches 201 may be formed by RIE etching, by ICP etching, or by any other adapted etching method. Before the actual etch step, a mask, not shown, may be arranged on the upper surface side of layer 105 to laterally delimit trenches 201.

FIG. 2B schematically illustrates the structure obtained at the end of a step of chemical treatment of the sides of the layers of quantum wells 103a exposed at the level of the lateral walls of trenches 201.

During this step, a chemical treatment capable of selectively etching the indium of the semiconductor alloy of layers 103a over at least another component of this alloy is applied to the sides of the LED stack at the level of the lateral walls of trenches 201. The chemical treatment may be applied by a wet process or by a gaseous process.

As an example, layers 103a are made indium gallium nitride with an indium content selected according to the desired emission wavelength, and the applied treatment is selected to be adapted to selectively etch the indium over the gallium and/or the nitrogen of the alloy. Selective etching here means that the applied treatment is capable of etching the indium faster than the gallium and/or the nitrogen of the alloy.

As an example, the treatment used is a hydrochloric acid (HCl) solution or an ammonium sulfide $(NH_4)_2S$ solution, which have the advantage of selectively etching indium over gallium. As a variant, a first treatment with a hydrochloric acid solution is applied, followed by a second treatment with an ammonium sulfide solution, or conversely.

As a (non-limiting) example, the etching is implemented in a bath of a 37% hydrochloric acid (HCl) solution diluted in deionized water by one volume of hydrochloric acid solution for nine volumes of deionized water, for approximately 10 minutes, at room temperature.

As a (non-limiting) variant, the etching is implemented in a 20% ammonium sulfide $(NH_4)_2S$ bath, for from 5 to 30 minutes, at room temperature.

At the end of this step, a peripheral portion 203 of each layer 103a of the LED, laterally extending from the side of the LED towards the center of the LED, has an indium concentration lower than the initial indium concentration of layer 103a. The indium concentration of layers 103a however remains unchanged in the central portion of the LED. As an example, at the end of the etch step, the indium concentration in the peripheral portion 203 of layer 103a is smaller by at least 20%, and preferably by at least 50%, than the indium concentration in a central portion of layer 103a.

It should be noted that since the indium is etched selectively over at least another component of the semiconductor alloy forming the layers of quantum wells 103a, the sides of portions 203 on the side of trenches 201 may in practice remain physically aligned with the sides of the other layers of the stack at the end of the treatment, as shown in FIG. 2B.

In the case where layers 103a are made of indium gallium nitride (InGaN), during the etching, the peripheral portions 203 of layers 103a are transformed into gallium nitride (GaN) or into indium-gallium nitride having an indium concentration lower than the initial concentration.

The indium etch depth (lateral dimension) depends on the etching time and on the concentration of the solution used. This depth however remains limited by the compactness of the crystalline semiconductor alloy forming layers 103a, which does not allow a deep penetration of the etching solution. As an example, the depth impacted by the etching (lateral dimension of regions 203) is in the range from 1 to 50 nm, for example, from 1 to 15 nm.

The selective etching of the indium of layers 103a at the periphery of the LED stack advantageously enables to widen the bandgap of layers 103a in the vicinity of the LED sides. As a result, the charge carriers are at least partially diverted from this area, and according remain distant from the area potentially degraded during the etching of trenches 201, and capable of comprising parasitic energy levels.

The studies conducted by the inventors have shown that this treatment enables to significantly decrease parasitic recombinations in the vicinity of the LED sides, and thus to substantially increase the quantum efficiency, particularly for LEDs having small lateral dimensions, for example, lateral dimensions smaller than 10 μm.

The provided treatment may be integrated to a method of passivation of the sides of a LED stack capable of comprising other steps, for example, other chemical and/or thermal treatments and/or a deposition of a dielectric passivation material on the sides of the stack.

To further improve the quantum efficiency, a LED having, in top view, a geometric shape resulting in limiting the LED perimeter for a given surface area, for example, a circular shape, may advantageously be formed. This enables to limit the volume of semiconductor material degraded during the etching of trenches 201, as compared with the total volume of semiconductor material of the LED.

Further, to limit the forming of parasitic energy levels in the vicinity of the sides of layers 103, it may advantageously be provided to limit the layer thickness of quantum wells 103a and/or the number of quantum wells 103a. As an example, a number of quantum wells 103a smaller than or equal to 10 and preferably smaller than or equal to 5 may be provided. Further, a thickness of each quantum well 103a smaller than or equal to 5 nm, for example, in the range from 1 to 3 nm, may be provided. The described embodiments are however not limited to these specific examples.

Various embodiments and variants have been described. Those skilled in the art will understand that certain features of these various embodiments and variants may be combined, and other variants will occur to those skilled in the art. In particular, the described embodiments are not limited to the examples of materials described hereabove. More particularly, the described embodiments are not limited to the above-described example where quantum wells 103a are made of indium gallium nitride (InGaN). More generally, the described embodiments apply whatever the composition of the crystalline semiconductor alloy forming the layers of quantum wells 103a, provided for this alloy to comprise indium and for the indium content in the alloy to determine the bandgap width of the alloy, and thus the emission wavelength of the LED. As an example, the material of the quantum well layers may be aluminum indium gallium phosphide (AlInGaP) or, more generally, any III-V compound, for example, ternary of quaternary, comprising indium and where the bandgap width is a function of the indium concentration of the alloy.

Further, the described embodiments are not limited to the numerical examples of etching solution mentioned hereabove. More generally, any other etching solution capable of selectively etching the indium over at least another compound of the semiconductor alloy forming the layers of quantum wells 103a may be used.

More generally, the provided solution may be adapted to any semiconductor alloy capable of being used to form quantum wells of a light-emitting diode with multiple quantum wells. In particular, the described embodiments are not limited to the selective etching of indium. More generally, whatever the composition of the semiconductor alloy forming the multiple quantum wells, a treatment capable of selectively etching a first component of the alloy over at least another component of the alloy will be selected, the first component being selected to be such that the bandgap width of the alloy is a function of the concentration of the first component in the alloy.

As an example, the semiconductor alloy forming the quantum wells may be a ternary III-V compound, for example, a compound from the group comprising:

aluminum gallium arsenide (AlGaAs, $Al_xGa_{1-x}As$);
indium gallium arsenide (InGaAs, $In_xGa_{1-x}As$);
indium gallium phosphide (InGaP);
aluminum indium arsenide (AlInAs);
aluminum indium antimonide (AlInSb);
gallium arsenide nitride (GaAsN);
gallium arsenide phosphide (GaAsP);
aluminum gallium nitride (AlGaN);
aluminum gallium phosphide (AlGaP);

indium gallium nitride (InGaN);

indium arsenide antimonide (InAsSb); and indium gallium antimonide (InGaSb).

As a variant, the semiconductor alloy forming the quantum wells may be a quaternary III-V compound, for example, a compound from the group comprising:

aluminum gallium indium phosphide (AlGaInP, or InAl-GaP, InGaAlP, AlInGaP);

aluminum gallium arsenide phosphide (AlGaAsP);

indium gallium arsenide phosphide (InGaAsP);

aluminum indium arsenide phosphide;

aluminum gallium arsenide nitride (AlGaAsN);

indium gallium arsenide nitride (InGaAsN);

indium aluminum arsenide nitride (InAlAsN); and gallium arsenide antimonide nitride (GaAsSbN).

As a variant, the semiconductor alloy forming the quantum wells may be a quinary III-V compound, for example, a compound from the group comprising:

gallium indium arsenide antimonide nitride (GaI-nAsSbN); and gallium indium arsenide antimonide phosphide (GaI-nAsSbP).

As a variant, the semiconductor alloy forming the quantum wells may be a binary II-VI compound, for example, a compound from the group comprising:

cadmium sulfide (CdS);

cadmium selenide (CdSe);

cadmium telluride (CdTe);

mercury sulfide (HgS);

mercury telluride (HgTe);

zinc oxide (ZnO);

zinc sulfide (ZnS);

zinc selenide (ZnSe); and zinc telluride (ZnTe).

As a variant, the semiconductor alloy forming the quantum wells may be a ternary II-VI compound, for example, a compound from the group comprising:

cadmium zinc telluride (CdZnTe, CZT);

mercury cadmium telluride (HgCdTe, MCT);

mercury zinc telluride (HgZnTe, MZT); and mercury zinc selenide (HgZnSe).

As a variant, the semiconductor alloy forming the quantum wells may be a IV-IV compound, for example, silicon germanium (SiGe).

The invention claimed is:

1. A light-emitting diode manufacturing method, comprising successive steps of:

a) forming an active layer comprising a stack of multiple quantum wells, each quantum well comprising a layer made of a semiconductor alloy;

b) forming a trench for singularizing the diode, said trench crossing the active layer; and c) applying to sides of the active layer, at a level of the lateral walls of the trench, a chemical treatment capable of etching a first component of the semiconductor alloy selectively over at least another component of the semiconductor alloy, wherein a bandgap width of the semiconductor alloy is a function of a concentration of the first component in the semiconductor alloy, wherein the chemical treatment applied at step c) is a wet treatment with a hydrochloric acid solution or an ammonium sulfide solution, and wherein the chemical treatment applied at step c) results in a lower concentration of the first component of the first semiconductor alloy in a peripheral portion of each layer of the first semiconductor alloy, the sides of the active layer of the first semiconductor alloy remaining physically aligned with sides of layers of a second semiconductor alloy.

2. The method according to claim 1, wherein the bandgap width of the semiconductor alloy is all the larger as the concentration of the first component in the alloy is low.

3. The method according to claim 1, wherein the semiconductor alloy of the quantum wells is a ternary III-V compound.

4. The method according to claim 1, wherein the semiconductor alloy of the quantum wells is a quaternary III-V compound.

5. The method according to claim 1, wherein the semiconductor alloy of the quantum wells is indium gallium nitride or aluminum indium gallium phosphide.

6. The method according to claim 1, wherein at step b), the trench is formed by a dry etching method.

7. The method according to claim 1, wherein, at step b), the trench is formed by RIE or ICP etching.

8. The method according to claim 1, wherein step a) further comprises forming of a first semiconductor layer of a first conductivity type, on a side of a first surface of the active layer, and forming of a second semiconductor layer of a second conductivity type opposite to the first conductivity type, on a side of a second surface of the active layer.

9. The method according to claim 8, wherein the trench formed at step b) thoroughly crosses the second semiconductor layer and the active layer, and emerges onto the upper surface or into the first semiconductor layer.

10. The method according to claim 1, wherein said first component of the semiconductor alloy of the quantum wells is indium.

* * * * *